United States Patent
Huang et al.

(10) Patent No.: US 8,655,197 B2
(45) Date of Patent: Feb. 18, 2014

(54) ELECTRONIC PAPER STRUCTURE AND METHOD FOR FABRICATING ELECTRONIC PAPER

(75) Inventors: Sung-Hui Huang, Taipei County (TW); Chuan-I Huang, Taipei (TW); Chin-Wen Lin, Miaoli County (TW); Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 357 days.

(21) Appl. No.: 13/038,402

(22) Filed: Mar. 2, 2011

(65) Prior Publication Data

US 2012/0075689 A1 Mar. 29, 2012

(30) Foreign Application Priority Data

Sep. 24, 2010 (TW) ................................ 99132362 A

(51) Int. Cl.
*G03G 15/00* (2006.01)
*H01S 4/00* (2006.01)
*H05K 3/30* (2006.01)
*G02B 26/00* (2006.01)

(52) U.S. Cl.
USPC ............... 399/3; 29/832; 29/592.1; 399/221; 399/310; 358/300; 359/296

(58) Field of Classification Search
USPC ............ 345/85, 92, 179, 204, 619, 690, 694; 361/272, 765, 679.01; 428/32, 12; 399/3, 221, 310; 358/300, 478; 427/58, 427/203, 458, 466, 96.9, 128; 156/272.2, 156/272.4, 297, 560, 711, 712, 753; 430/32; 29/832, 592.1; 359/296

See application file for complete search history.

(56) References Cited

U.S. PATENT DOCUMENTS

| | | | |
|---|---|---|---|
| 2010/0151601 A1 | 6/2010 | Park | |
| 2011/0094675 A1* | 4/2011 | Sato et al. | 156/297 |
| 2012/0017434 A1* | 1/2012 | Lee et al. | 29/832 |

FOREIGN PATENT DOCUMENTS

| | | |
|---|---|---|
| CN | 1734338 A | 2/2006 |
| TW | 201013605 A | 4/2010 |
| TW | 201026496 A | 7/2010 |

OTHER PUBLICATIONS

The office action of the corresponding Chinese application No. 201010518013.X.

* cited by examiner

*Primary Examiner* — Evelyn A. Lester
(74) *Attorney, Agent, or Firm* — CKC & Partners Co., Ltd.

(57) ABSTRACT

An electronic paper structure is disclosed, which includes a hard substrate, a flexible substrate, at least one magnetic device for fastening the flexible substrate on the hard substrate temporally, a drive substrate formed on the flexible substrate, an electronic paper display layer formed on the drive substrate, and a protect layer formed on the electronic paper display layer. An electronic paper fabricating method using the same is also disclosed.

10 Claims, 5 Drawing Sheets

S20

S22

S24

S30

S32

S34

S50

S52

S54

ELECTRONIC PAPER STRUCTURE AND METHOD FOR FABRICATING ELECTRONIC PAPER

RELATED APPLICATIONS

This application claims priority to Taiwan Application Serial Number 099132362, filed Sep. 24, 2010, which is herein incorporated by reference.

BACKGROUND

1. Field of Invention

The present invention relates to a display deice. More particularly, the present invention relates to a structure and method of electronic paper.

2. Description of Related Art

An Electronic Paper Display (EPD) is a display that possesses a paper-like high contrast appearance, ultra-low power consumption, and a thin, flexible and light form. It gives the viewer the experience of reading from paper, while having the power of updatable information.

In the conventional process for fabricating the flexible electronic paper, a plastic film is stuck on a substrate, and a drive substrate including thin film transistors is formed on the plastic film, and then an electronic paper display layer is formed on the drive substrate, and a protect layer is formed on the electronic paper display layer. Then the plastic film is heated or ultraviolet irradiated to be separated form the substrate. Another conventional method for fabricating the flexible electronic paper includes applying a polyimide layer on the substrate, and the drive substrate, the electronic paper display layer, and the protect layer are formed on the polyimide layer in order. Then a laser beam is used for destroy the chemical bonding between the polyimide layer and the substrate for peeling the substrate.

However, the above process of heating, ultraviolet irradiation, or laser emitting for peeling the substrate may spend extra time, and the thin film transistors of the drive substrate might be destroyed during peeling the substrate, such that the yield of the product may be reduced.

SUMMARY

An object of the invention is to provide an electronic paper structure and fabricating method thereof to prevent the thin film transistor from being destroyed during peeling the substrate.

An aspect of the invention is an electronic paper structure, which includes a hard substrate, a flexible substrate, at least one magnetic device for fastening the flexible substrate on the hard substrate temporally, a drive substrate formed on the flexible substrate, an electronic paper display layer formed on the drive substrate, and a protect layer formed on the electronic paper display layer.

The least one of magnetic device can be a first magnetic material layer and a second magnetic material layer disposed on opposite sides of the hard substrate, wherein the second magnetic material layer is further transferred to the flexible substrate. The least one of magnetic device can be a first magnetic material layer and a second magnetic material layer disposed on a side of the hard substrate, wherein the second magnetic material layer is further transferred to the flexible substrate. The hard substrate can be a magnetic substrate, and the least one magnetic device is a magnetic material layer disposed on the flexible substrate. The hard substrate can be a magnetic substrate, and the least one magnetic device is at least one magnetic fastener, wherein the flexible substrate is fastened between the magnetic fastener and the magnetic substrate. Methods for using the electronic paper structures thereof for fabricating electronic papers are also provided.

Another aspect of the invention is an electronic paper structure, which includes a hard magnetic substrate, a flexible magnetic substrate fastened on the hard magnetic substrate temporally, a drive substrate formed on the flexible magnetic substrate, an electronic paper display layer formed on the drive substrate, and a protect layer formed on the electronic paper display layer. A method for using the electronic paper structure for fabricating an electronic paper is also provided.

Another aspect of the invention is a flexible electronic paper, which includes a magnetic material layer, a flexible substrate formed on the magnetic material layer, a drive substrate formed on the flexible substrate, an electronic paper display layer formed on the drive substrate, and a protect layer formed on the electronic paper display layer.

The flexible substrate can be fastened on the hard substrate temporally with the attractive magnetic force provided during the fabricating process of the electronic paper structure of the invention. The flexible substrate can be easily separated from the hard substrate after the magnetic force does not exist. The process time can be reduced, and the situation of thin film transistor damage due to peeling the substrate can be also prevented in the present invention.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
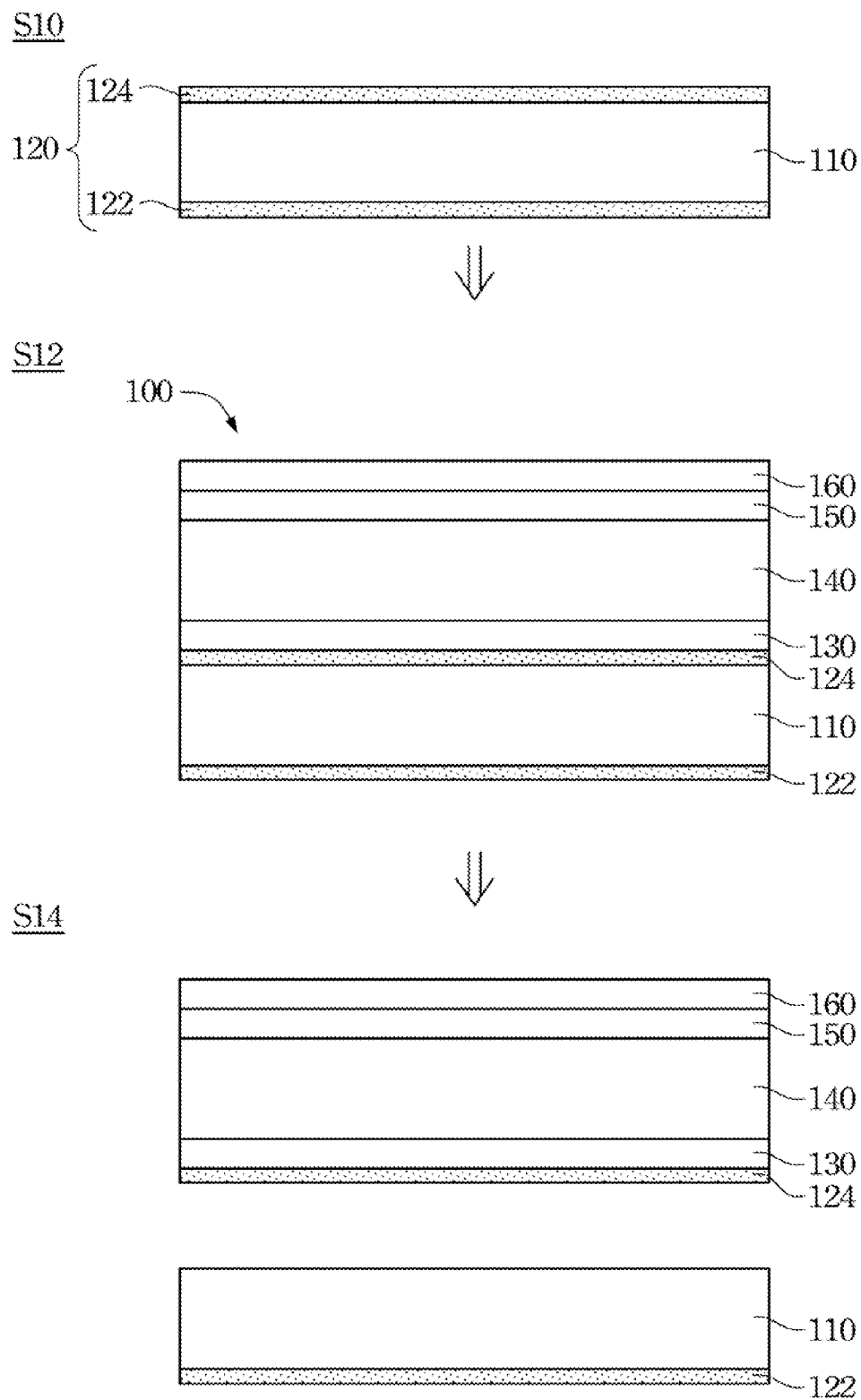
FIG. 1 is a schematic diagram of a fabricating process of a first embodiment of the electronic paper structure of the invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a schematic diagram of a fabricating process of a first embodiment of the electronic paper structure of the invention. At least one magnetic device 120 is formed on the hard substrate 110 in step S10. The magnetic device 120 includes a first magnetic material layer 122 and a second magnetic material layer 124 disposed on opposite sides of the hard substrate 110. The first magnetic material layer 122 and the second magnetic material layer 124 have magnetic characteristic and can be magnetized in step S10. The first magnetic layer 122 and the second magnetic layer 124 are magnetized, so that the first magnetic material layer 122 and the second magnetic material layer 124 can attract each other. The method for magnetizing the first magnetic material 122 and the second magnetic material 124 includes applying an electric field between the first magnetic material layer 122 and the second magnetic material layer 124.

Then, a flexible substrate 130 is formed on the second magnetic material layer 124 in step S12. The flexible substrate 130 is combined with the second magnetic material layer 124, i.e. the second magnetic material layer 124 is transferred to the flexible substrate 130. The attractive magnetic force between the first magnetic material layer 122 and the second magnetic material layer 124 can temporally fasten the flexible substrate 130 on the hard substrate 110. Then a drive substrate 140, an electronic paper display layer 150, and a protect layer 160 are formed on the flexible substrate 130 in order, thus an electronic paper structure 100 is provided. The drive substrate 140 includes a thin film transistor array and a drive circuit.

Finally, the first magnetic material layer 122 and the second magnetic layer 124 are demagnetized in step S14. The electric field between the first magnetic material layer 122 and the second magnetic material layer 124 is ceased being applied in step S14. The attractive magnetic force does not exist between the first magnetic material layer 122 and the second magnetic material layer 124, so that the flexible substrate 130 can be separated from the hard substrate 110 easily. The flexible substrate 130, the drive substrate 140, the electronic paper display layer 150, and the protection layer 160 constitute a flexible electronic paper.

Figure 2:
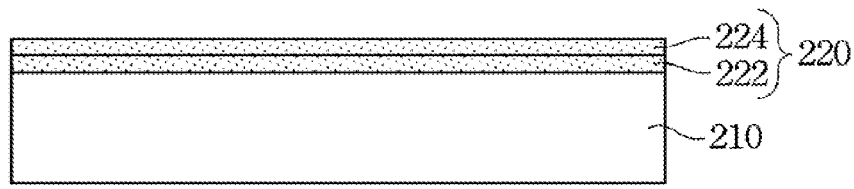
FIG. 2 is a schematic diagram of a fabricating process of a second embodiment of the electronic paper structure of the invention.
Figure 2:
Figure 2:
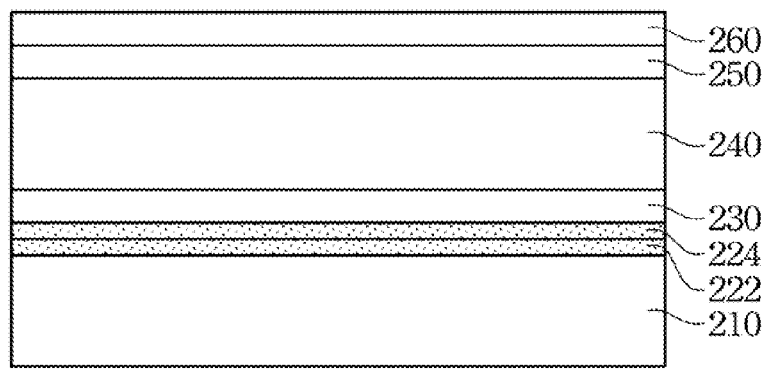
Figure 2:
Figure 2:
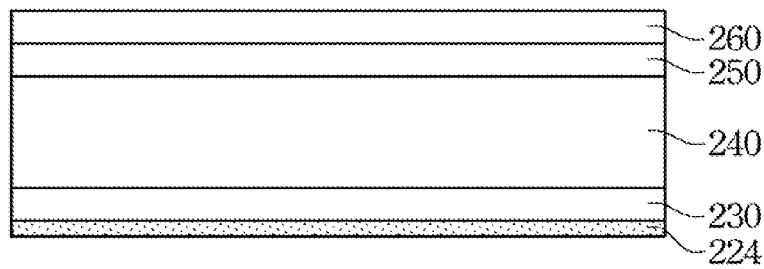
Figure 2:
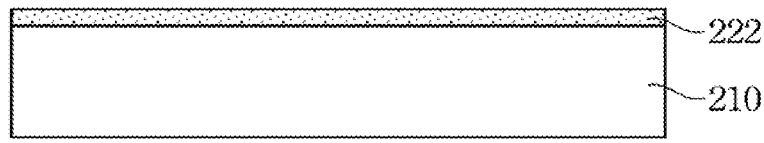

FIG. 2 is a schematic diagram of a fabricating process of a second embodiment of the electronic paper structure of the invention. The magnetic device 220 is formed on the hard substrate 210 in Step S20. The magnetic device 220 includes the first magnetic material layer 222 formed on a side of the hard substrate 210, and the second magnetic material layer 224 formed on the first magnetic material layer 222. The first magnetic material layer 222 and the second magnetic material layer 224 are further magnetized in step S20. The first magnetic layer 222 and the second magnetic layer 224 are magnetized, so that the first magnetic material layer 222 and the second magnetic material layer 224 can attract each other. The method for magnetizing the first magnetic material 222 and the second magnetic material 224 includes applying an electric field between the first magnetic material layer 222 and the second magnetic material layer 224.

Then the flexible substrate 230 is formed on the second magnetic material layer 224, and the second magnetic material layer 224 is transferred and combined with the flexible substrate 230 in step S22. The attractive force between the first magnetic material layer 222 and the second magnetic material layer 224 would fasten the flexible substrate 230 on the hard substrate 210 temporally. Then the drive substrate 240, the electronic paper display layer 250, and the protect layer 260 are formed on the flexible substrate 230 in order, thus the electronic paper structure 200 is provided. The drive substrate 240 includes the thin film transistor array and the drive circuit.

Finally, the first magnetic material layer 222 and the second magnetic material layer 224 are demagnetized in step S24, wherein the electric field between the first magnetic material layer 222 and the second magnetic material layer 224 is ceased being applied in step S24. Therefore, the attractive magnetic force does not exist between the first magnetic material layer 222 and the second magnetic material layer 224, so that the flexible substrate 230 can be separated from the hard substrate 210 easily. The flexible substrate 230, the drive substrate 240, the electronic paper display layer 250, and the protection layer 260 constitute the flexible electronic paper.

Figure 3:
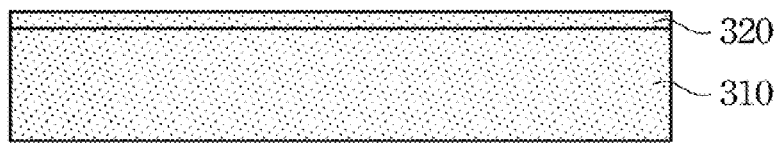
FIG. 3 is a schematic diagram of a fabricating process of a third embodiment of the electronic paper structure of the invention.
Figure 3:
Figure 3:
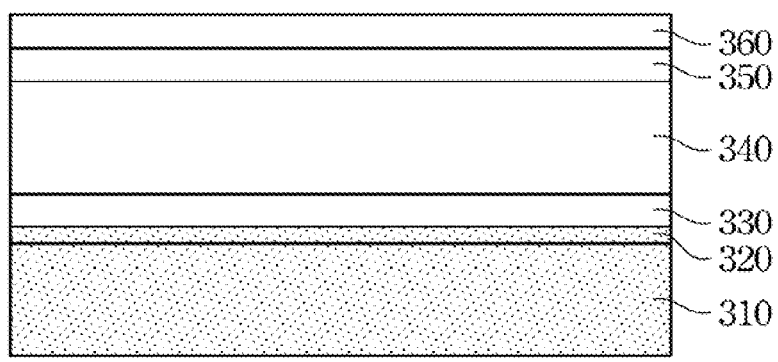
Figure 3:
Figure 3:
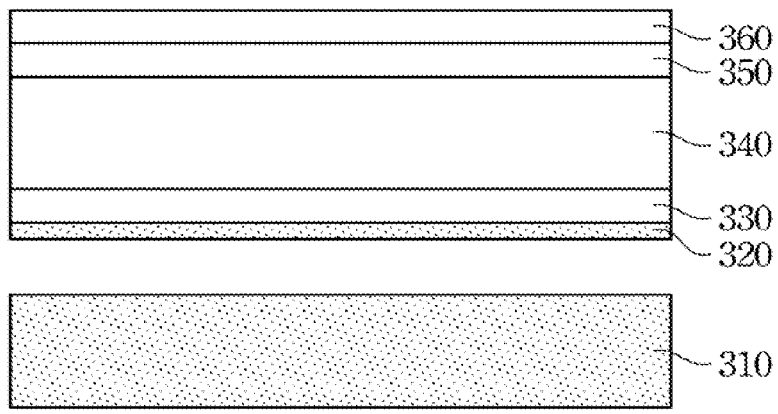

FIG. 3 is a schematic diagram of a fabricating process of a third embodiment of the electronic paper structure of the invention. The magnetic device 320 is formed on the hard substrate 310 in step S30. The hard substrate 310 of the present embodiment is a magnetic substrate. The magnetic device 320 is a magnetic material layer formed on a side of the magnetic substrate 310. The magnetic device 320 and the hard substrate 310 are further magnetized in step S30. The magnetic device 320 and the hard substrate 310 are magnetized, so that the magnetic device 320 and the hard substrate 310 can attract each other. The method for magnetizing the magnetic device 320 and the hard substrate 310 includes applying an electric field between the magnetic device 320 and the hard substrate 310.

Then the flexible substrate 330 is formed on the magnetic device 320, and the magnetic device 320 is transferred and combined with the flexible substrate 330 in step S32. The attractive force between magnetic device 320 and the hard substrate 310 would fasten the flexible substrate 330 on the hard substrate 310 temporally. Then the drive substrate 340, the electronic paper display layer 350, and the protect layer 360 are formed on the flexible substrate 330 in order, thus the electronic paper structure 300 is provided. The drive substrate 340 includes the thin film transistor array and the drive circuit.

Finally, the magnetic device 320 and the hard substrate 310 are demagnetized in step S34, wherein the electric field between the magnetic device 320 and hard substrate 310 is ceased being applied in step S34. Therefore, the attractive magnetic force does not exist between the magnetic device 320 and hard substrate 310, so that the flexible substrate 330 can be separated from the hard substrate 310 easily. The flexible substrate 330, the drive substrate 340, the electronic paper display layer 350, and the protection layer 360 constitute the flexible electronic paper.

Figure 4:
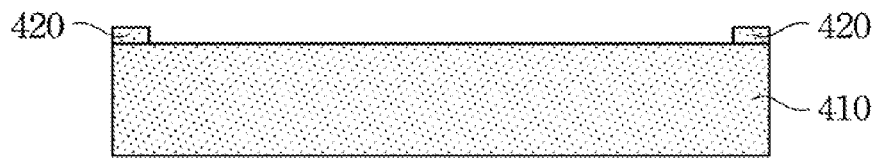
FIG. 4 is a schematic diagram of a fabricating process of a fourth embodiment of the electronic paper structure of the invention.
Figure 4:
Figure 4:
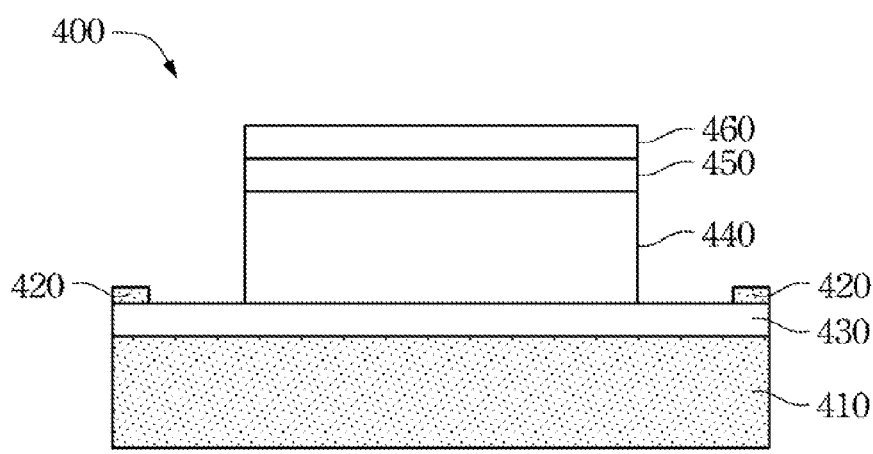
Figure 4:
Figure 4:
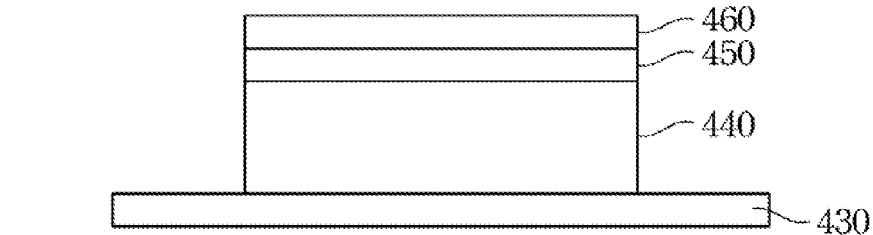
Figure 4:
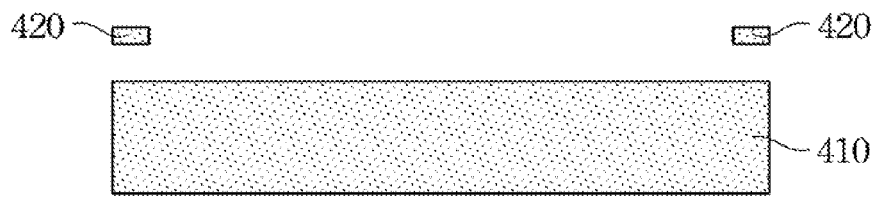

FIG. 4 is a schematic diagram of a fabricating process of a fourth embodiment of the electronic paper structure of the invention. The hard substrate 410 made of magnetic material and at least one magnetic fastener 420 are provided in step S40. The hard substrate 410 and the magnetic fastener 420 can be made of a permanent magnet.

Then, the flexible substrate 430 is provided in step S42, wherein the flexible substrate 430 is disposed between the magnetic fastener 420 and the hard substrate 410. The attractive magnetic force between the magnetic fastener 420 and the hard substrate 410 would fasten the flexible substrate 430 on the hard substrate 410 temporally. Then the drive substrate 440, the electronic paper display layer 450, and the protect layer 460 are formed on the flexible substrate 430 in order, thus the electronic paper structure 400 is provided. The drive substrate 440 includes the thin film transistor array and the drive circuit.

Finally, the magnetic fastener 420 is removed in step S44 to cease the attractive magnetic force between the magnetic fastener 420 and the hard substrate 410. Therefore the flexible substrate 430 can be separated from the hard substrate 410 easily. The flexible substrate 430, the drive substrate 440, the electronic paper display layer 450, and the protection layer 460 constitute the flexible electronic paper. The superfluous part of the flexible substrate 430 for being placed by the magnetic fastener 420 can be further cut.

Figure 5:
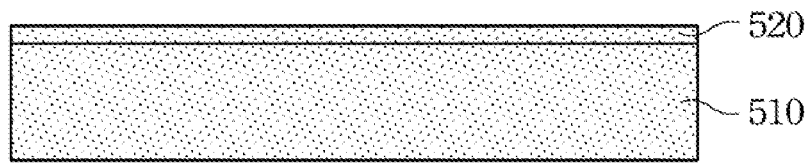
FIG. 5 is a schematic diagram of a fabricating process of a fifth embodiment of the electronic paper structure of the invention.
Figure 5:
Figure 5:
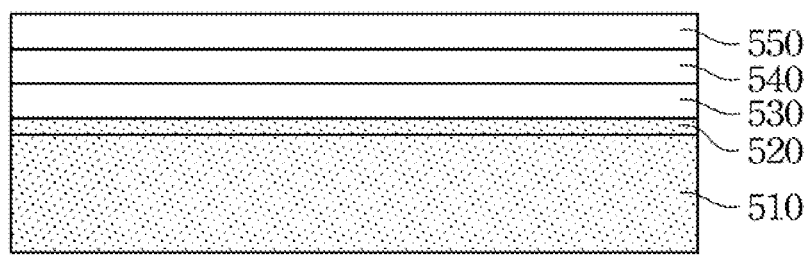
Figure 5:
Figure 5:
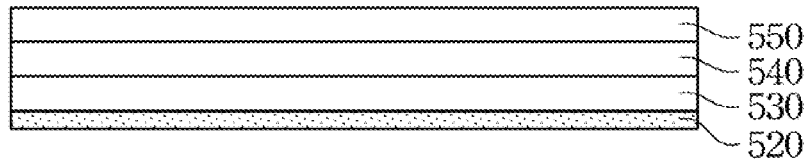
Figure 5:
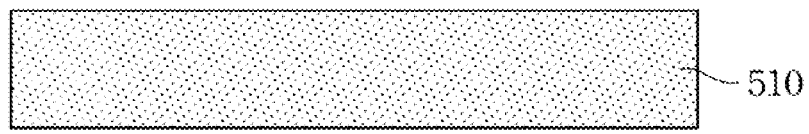

FIG. 5 is a schematic diagram of a fabricating process of a fifth embodiment of the electronic paper structure of the invention. A hard magnetic substrate 510 and a flexible magnetic substrate 520 are provided in step S50. The hard magnetic substrate 510 and the flexible magnetic substrate 520 are further magnetized in step S50. The method for magnetizing the hard magnetic substrate 510 and the flexible magnetic substrate 520 includes applying an electric field between the hard magnetic substrate 510 and the flexible magnetic substrate 520. The hard magnetic substrate 510 and the flexible magnetic substrate 520 are magnetized, so that the hard magnetic substrate 510 and the flexible magnetic substrate 520 can attract each other, and the flexible magnetic substrate 520 can be fastened on the hard magnetic substrate 510 temporally.

Then the drive substrate 530, the electronic paper display layer 540, and the protect layer 550 are formed on the flexible magnetic substrate 520 in order, thus the electronic paper structure 500 is provided. The drive substrate 530 includes the thin film transistor array and the drive circuit.

Finally, the hard magnetic substrate 510 and the flexible magnetic substrate 520 are demagnetized in step S54, wherein the electric field between the hard magnetic substrate 510 and the flexible magnetic substrate 520 is ceased being applied in step S54. Therefore, the attractive magnetic force does not exist between the hard magnetic substrate 510 and the flexible magnetic substrate 520, so that the hard magnetic substrate 510 and the flexible magnetic substrate 520 easily. The flexible substrate 520, the drive substrate 530, the electronic paper display layer 540, and the protection layer 550 constitute the flexible electronic paper.

The hard substrate can be a glass. The magnetic substrate can be the metal substrate blended with ferrum, cobalt, or nickel, an alloy with magnetic, or an oxide substrate. The magnetic material layer can be formed on the hard substrate with evaporation deposition or sputtering. The material of the magnetic material layer can be metal blended with ferrum, cobalt, or nickel, an alloy with magnetic, or an oxide. The material of the flexible substrate can be a plastic. The material of the protect layer can be a plastic.

According to the above embodiments, the present invention has following advantages. The flexible substrate can be fastened on the hard substrate temporally with the attractive magnetic force provided during the fabricating process of the electronic paper structure of the invention. The flexible substrate can be easily separated from the hard substrate after the magnetic force does not exist. The process time can be reduced, and the situation of thin film transistor damage due to peeling the substrate can be also prevented in the present invention.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic paper structure, comprising:
   a hard substrate;
   a flexible substrate;
   at least one magnetic device for fastening the flexible substrate on the hard substrate temporally;
   a drive substrate formed on the flexible substrate;
   an electronic paper display layer formed on the drive substrate; and
   a protect layer formed on the electronic paper display layer, wherein the least one of magnetic device comprises a first magnetic material layer and a second magnetic material layer disposed on opposite side of the hard substrate, wherein the second magnetic material layer is combined with the flexible substrate, wherein the hard substrate is sandwiched between the first magnetic material layer and the second magnetic material layer.

2. An electronic paper structure, comprising,
   hard substrate;
   a flexible substrate;
   at least one magnetic device for fastening the flexible substrate on the hard substrate temporally;
   a drive substrate formed on the flexible substrate;
   an electronic paper display layer formed on the drive substrate; and
   a protect layer formed on the electronic paper display layer, wherein the least one of magnetic device comprises a first magnetic material layer and a second magnetic material layer disposed on a side of the hard substrate, wherein the second magnetic material layer is combined with the flexible substrate, wherein the first magnetic material layer is sandwiched between the hard substrate and the second magnetic material layer.

3. An electronic paper structure, comprising:
   a hard substrate;
   a flexible substrate;
   at least one magnetic device for fastening the flexible substrate on the hard substrate temporally;
   a drive substrate formed on the flexible substrate;
   an electronic paper display layer formed on the drive substrate; and
   a protect layer formed on the electronic paper display layer, wherein the hard substrate is a magnetic substrate, and the least one magnetic device is a magnetic material layer disposed on the flexible substrate.

4. An electronic paper structure, comprising:
   a hard substrate;
   a flexible substrate;
   at least one magnetic device for fastening the flexible substrate on the hard substrate temporally;
   a drive substrate formed on the flexible substrate;
   an electronic paper display layer formed on the drive substrate; and
   a protect layer formed on the electronic paper display layer, wherein the hard substrate is a magnetic substrate, and the least one magnetic devices is at least one magnetic fastener, wherein the flexible substrate is fastened between the magnetic fastener and the magnetic substrate.

5. A method for fabricating an electronic paper, comprising:
   using a magnetic device for fastening a flexible substrate on a hard substrate temporally;
   forming a drive substrate on the flexible substrate;
   forming an electronic paper display layer on the drive substrate;
   forming a protect layer on the electronic paper display layer; and separating the hard substrate and the flexible substrate, wherein the step of using a magnetic device for fastening a flexible substrate on a hard substrate temporally comprises:
providing a magnetic attractive force between the hard substrate and the flexible substrate, wherein the step of providing a magnetic attractive force between the hard substrate and the flexible substrate comprises:
magnetizing a first magnetic material layer on the hard substrate and a second magnetic material layer on the flexible substrate.

6. The method for fabricating an electronic paper of claim 5, wherein the step of separating the hard substrate and the flexible substrate comprises:
demagnetizing the first magnetic material layer and the second magnetic material layer.

7. A method for fabricating an electronic paper, comprising:
using a magnetic device for fastening a flexible substrate on a hard substrate temporally;
forming a drive substrate on the flexible substrate;
forming an electronic paper display layer on the drive substrate;
forming a protect layer on the electronic paper display layer; and
separating the hard substrate and the flexible substrate, wherein the step of using a magnetic device for fastening a flexible substrate on a hard substrate temporally comprises:
providing a magnetic attractive force between the hard substrate and the flexible substrate, wherein the hard substrate is a magnetic substrate, and the step of providing a magnetic attractive force between the hard substrate and the flexible substrate comprises:
magnetizing the magnetic substrate and a magnetic material layer on the flexible substrate.

8. The method for fabricating an electronic paper of claim 7, wherein the step of separating the hard substrate and the flexible substrate comprises:
demagnetizing the magnetic substrate and the second magnetic material layer.

9. A method for fabricating an electronic paper, comprising:
using a magnetic device for fastening a flexible substrate on a hard substrate temporally;
forming a drive substrate on the flexible substrate;
forming an electronic paper display layer on the drive substrate;
forming a protect layer on the electronic paper display layer; and
separating the hard substrate and the flexible substrate, wherein the hard substrate is a magnetic substrate, and the magnetic device is a magnetic fastener, and the step of using a magnetic device for fastening a flexible substrate on a hard substrate temporally comprises:
placing the flexible substrate between the magnetic substrate and the magnetic fastener.

10. The method for fabricating an electronic paper of claim 9, wherein the step of separating the hard substrate and the flexible substrate comprises:
removing the magnetic fastener from the flexible substrate.

* * * * *